(12) United States Patent
Castellano

(10) Patent No.: US 8,911,818 B2
(45) Date of Patent: Dec. 16, 2014

(54) NANODIAMOND COATINGS FOR SOLAR CELLS

(76) Inventor: Robert N. Castellano, New Tripoli, PA (US)

( * ) Notice: Subject to any disclaimer, the term of this patent is extended or adjusted under 35 U.S.C. 154(b) by 79 days.

(21) Appl. No.: 13/210,425

(22) Filed: Aug. 16, 2011

(65) Prior Publication Data

US 2012/0027924 A1     Feb. 2, 2012

Related U.S. Application Data

(63) Continuation-in-part of application No. 13/010,220, filed on Jan. 20, 2011, now abandoned.

(60) Provisional application No. 61/296,709, filed on Jan. 20, 2010.

(51) Int. Cl.
| | |
|---|---|
| *B05D 5/00* | (2006.01) |
| *H01L 31/0236* | (2006.01) |
| *H01L 31/0216* | (2014.01) |
| *C09D 7/12* | (2006.01) |
| *C09D 5/32* | (2006.01) |
| *B82Y 30/00* | (2011.01) |
| *C08K 3/04* | (2006.01) |

(52) U.S. Cl.
CPC .............. *B82Y 30/00* (2013.01); *Y02E 10/50* (2013.01); *H01L 31/02363* (2013.01); *H01L 31/02168* (2013.01); *H01L 31/02366* (2013.01); *C09D 7/1266* (2013.01); *C09D 5/32* (2013.01); *C09D 7/1216* (2013.01); *C08K 3/04* (2013.01)
USPC .......................................................... 427/74

(58) Field of Classification Search
USPC ........................................................... 427/74
See application file for complete search history.

(56) References Cited

U.S. PATENT DOCUMENTS

| | | | | |
|---|---|---|---|---|
| 4,853,594 | A * | 8/1989 | Thomas .................... | 313/503 |
| 2007/0152370 | A1* | 7/2007 | Roberts et al. ............. | 264/255 |
| 2010/0140562 | A1* | 6/2010 | Shenderova et al. ...... | 252/511 |

OTHER PUBLICATIONS

Morimune et al., "Poly(vinyl alcohol) Nanocomposites with Nanodiamond," Macromolecules 44, pp. 4415-4421 (May 3, 2011).*

* cited by examiner

*Primary Examiner* — Robert Vetere

(57) ABSTRACT

A nanodiamond coating for use on a solar cell, the coating including a nanodiamond material suspended in a liquid, wherein the nanodiamond material has a size range from about 1 nm to about 10 nm. Methods for improving the efficiency of a solar cell, including mixing a nanodiamond material with a liquid polymer or non-polymer solvent to form a nanodiamond-polymer suspension, forming a coating of the suspension on a top surface of a solar cell, and drying the coating such that a dried nanodiamond-polymer layer remains bonded to the solar cell.

28 Claims, 12 Drawing Sheets

SEM Image of Monodispersed SolarPA "NanoCoat OverCoat" Coating on a Silicon Solar Cell HRTEM Image of Polydispersed SolarPA "NanoCoat" Coating on Silicon (images courtesy NTC)

NANODIAMOND COATINGS FOR SOLAR CELLS

CROSS-REFERENCE TO RELATED APPLICATIONS

This application is a Continuation-in-Part of U.S. patent application Ser. No. 13/010,220, now abandoned, filed on Jan. 20, 2011, which claims priority from U.S. Provisional Application No. 61/290,709, filed on Jan. 20, 2010, each of which is incorporated by reference herein in its entirety.

BACKGROUND

Conventional photovoltaic solar cells typically have a conversion efficiency from solar radiation to electricity of not much greater than about 15%. While a large portion of the inefficiency of a solar cell is due to quantum efficiency limitation, i.e., the percentage of incident-radiation that a photovoltaic material can be converted into electricity by creating an electron-hole pair in the photovoltaic material of the solar cell, some of the inefficiency is due to reflection of incident radiation as well as the sub-optimal angle of incidence of radiation reaching the photovoltaic material. Therefore, significant improvements in the efficiency of a solar cell may be possible by decreasing the reflection of incident radiation and by improving the angle of incidence of radiation that approaches the solar cell at a sub-optimal angle.

A process for making a conventional solar cell is shown in FIG. 1. Silicon wafers are cleaned with industrial soaps and then etched using hot sodium hydroxide to remove saw damage. The wafers are further etched in a hot solution of sodium hydroxide and isopropanol to form square-based pyramids; this etching step is sometimes called texturization. Texturization helps reduce the reflection of sunlight. Left untreated, the surface of a photovoltaic cell can act like a mirror, reflecting more than 30% of the light that strikes it.

Since the wafers are pre-doped with boron (p-type), an n-type material is diffused into the wafer, to achieve n-p junction. Phosphorous is the a common diffusant, and diffusion of phosphorous is achieved by subjecting the wafers at high temperature to a phosphorous source. However, deposited phosphosilicate glass may form during the diffusion process, and must be removed.

To further reduce the surface reflection of incident light, an anti-reflection coating (ARC) including a material such as silicon nitride or titanium oxide is applied on the surface. Anti-reflection coatings increase the amount of light coupled into the solar cell. Silicon nitride has gradually replaced titanium dioxide as a preferred anti-reflection coating because of its excellent surface passivation qualities, which prevent carrier recombination at the surface of the solar cell.

Silver is the most widely used metal for contact formation with the silicon-based photovoltaic cell, due to its solderability. Silver in the form of a paste is screen-printed onto the front and the rear of the cell. In addition, aluminum paste is also used onto the rear to achieve a Back Surface Field (BSF), which improves the performance of the solar cell. The paste is then fired at several hundred degrees Celsius to form metal electrodes in ohmic contact with the silicon.

A typical silicon solar cell reflects about one-third of, the incident light that could potentially be converted into electricity.

SUMMARY

An embodiment of nanodiamond coating is described for use on a solar cell. The coating includes a nanodiamond material suspended in a liquid, wherein the nanodiamond material has a size range from about 1 nm to about 10 nm. The liquid may include a non-polymer solvent or a polymer solvent.

An embodiment of a method is described for improving the efficiency of a solar cell. The method includes mixing a nanodiamond material with a liquid polymer to form a nanodiamond-polymer suspension, coating the suspension on atop surface of a solar cell, and drying the suspension such that a dried nanodiamond-polymer layer remains bonded to the solar cell.

Another method is described for improving the efficiency of a solar cell. The method includes suspending a nanodiamond material with a non-polymer solvent to form a suspension, coating the suspension on a top surface of a photovoltaic material within the solar cell, and drying the coating such that a dried nanodiamond layer remains bonded to the photovoltaic material.

FIGURES

The foregoing summary, as well as the following detailed description of the embodiments, will be better understood when read in conjunction with the appended drawings. For the purpose of illustration, there are shown in the drawings some embodiments which may be preferable. It should be understood, however, that the embodiments depicted are not limited to the precise arrangements and instrumentalities shown.

DETAILED DESCRIPTION

As disclosed herein, improvements in the efficiency of a solar cell can be obtained by forming an outer nanodiamond coating on a top surface of the solar cell, by incorporating an inner nanodiamond coating into the solar on top of the photovoltaic material, or by a combination of the two coatings. The nanodiamond particles are preferably of a round or irregular shape having an average diameter of less than or equal to about 0.1 micron (100 nanometers). Most of the particles preferably have a size between about 1 nm and about 10 nm, and are more preferably between about 5 nm and about 7 nm. The nanodiamond particles can be formed by a process as disclosed in U.S. Pat. No. 5,861,349 or U.S. Pat. No. 5,916,955, each of which is incorporated by reference herein in its entirety.

The nanodiamond particles each include a mechanically stable, chemically inert core and a chemically active surface. By functionalizing the nanodiamond particle, surface with targeted species, the nanodiamond can be provided with specified chemical, physical, and electronic properties. Functionalization can be done by various chemical, photochemical, and electrochemical methods to graft different organic functionalities onto the nanodiamond. Depending on the desired physical property and application of the nanodiamond, functionalized nanodiamond materials can be fluorinated, chlorinated, carboxylated, aminated, hydroxylated, and sulfonated. In the testing described herein, aminated nanodiamond particles were used, but any of the other types of functionalized nanodiamonds could alternatively be used.

Outer Nanomaterial Coating.

Figure 1:
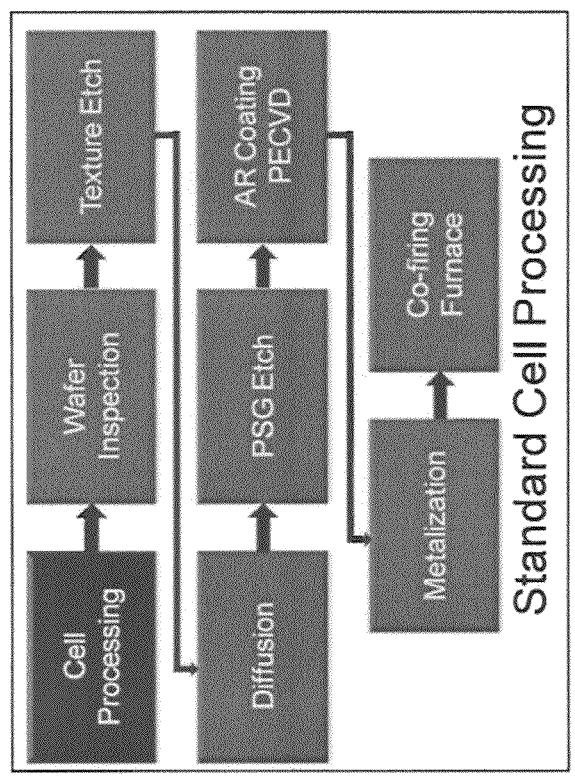
FIG. 1 is a flow chart showing a prior art method for processing a solar cell.
Figure 2:
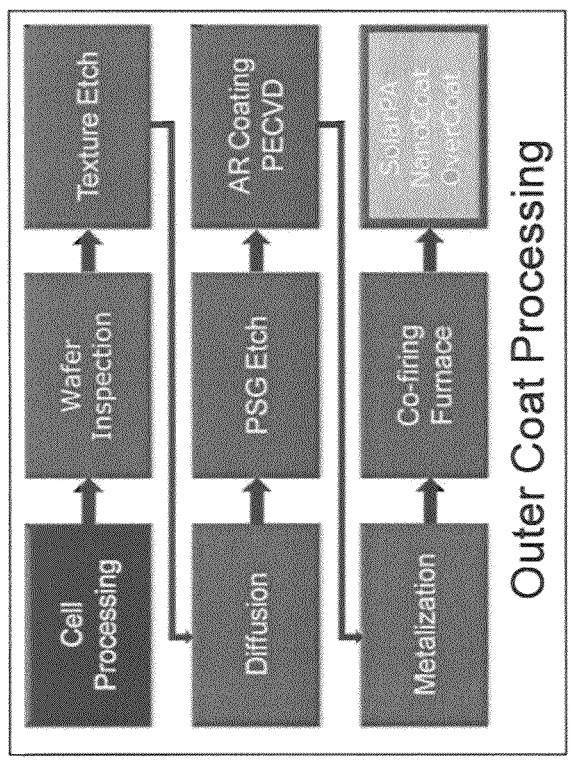
FIG. 2 is a flow chart showing a method of processing a solar cell including an outer nanodiamond coating.

FIG. 2 shows an exemplary process of making a solar cell having an outer nanodiamond coating. In particular, after a solar cell has been manufactured according to a conventional process (e.g., as in FIG. 1), an outer coating is formed on the top surface of the solar cell. The outer nanodiamond coating is formed from a mixture of nanodiamond particles and a binder or matrix material that is capable of creating a substantially uniform distribution of nanodiamond particles, such as a liquid polymer that can be spread in a thin layer and dried.

The coating of nanodiamond particles suspended in the matrix material may be applied to the top surface of the solar cell by various methods. A manual blade method has been used to obtain a substantially uniform coating, by first applying the suspension to the top surface of the solar cell and then drawing a blade across the suspension to form the suspension to a desired thickness. Other techniques may also be used to obtain a uniform coating, including but not limited to screen printing of the suspension and dip-coating of the suspension. In some cases, and in particular for coating an amorphous Si substrate, spray coating may be used. Regardless the method of application, the suspension is then dried to a film coating by allowing or encouraging the evaporation of volatile components in the suspension, such as solvents in a PVDF resin.

Figure 9A:
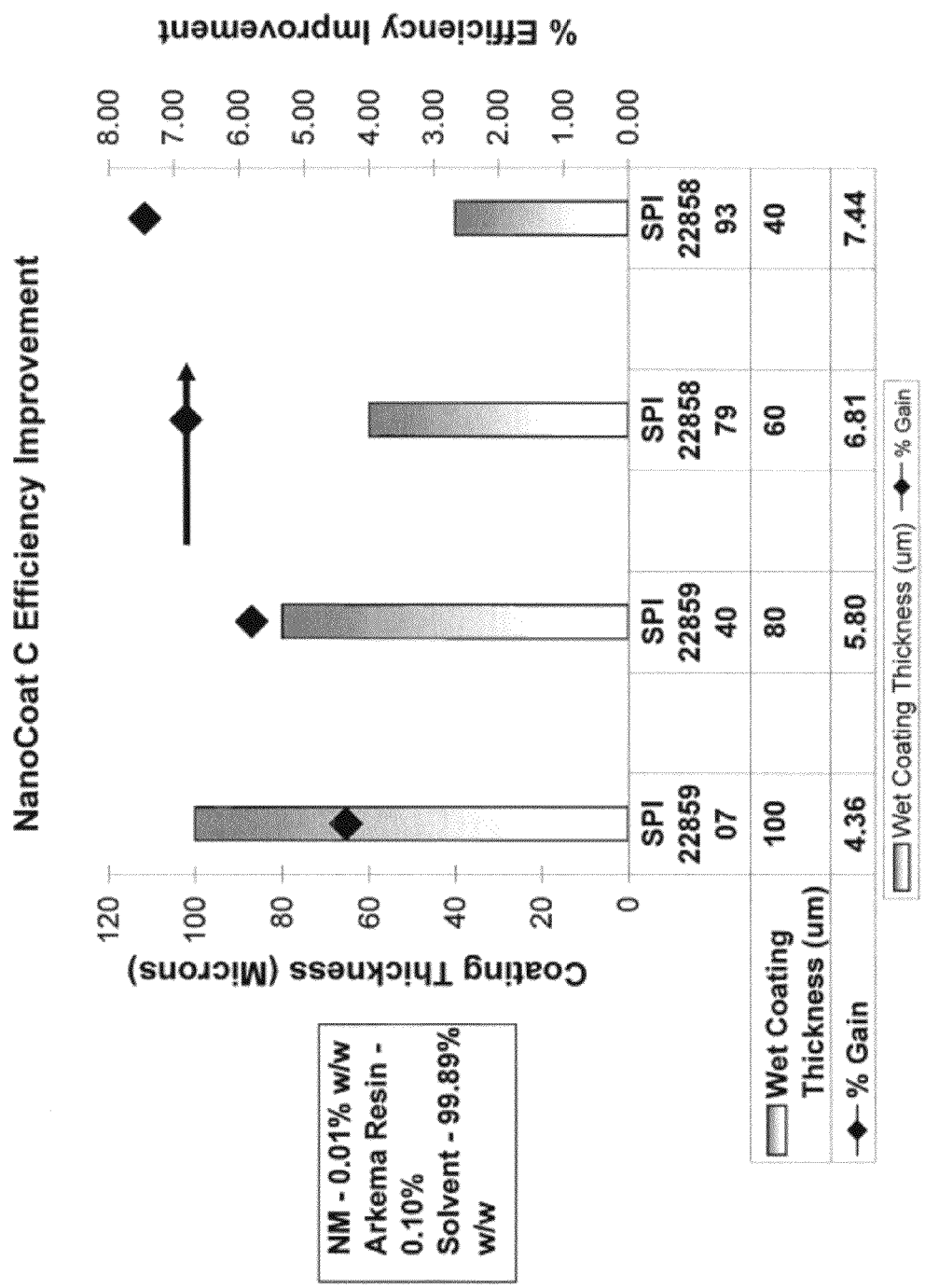
FIG. 9A is a graph showing the efficient of a solar cell as a function of an outer nanodiamond coating thickness.

In several embodiments, polyvinylidine fluoride (PVDF) resin sold under the brand name Kynara® by Arkema, Inc. was used as the polymer matrix material. Nanodiamond was blended into a liquid. PVDF material for coating on a solar cell. In one example, a suspension was made including 0.01% w/w nanodiamond, 0.1% w/w of PVDF resin, and the balance dimethyl sulfoxide (DMSO). A coating of the suspension was applied to the top-surface of the solar cell and allowed to dry, leaving the nanodiamond particles suspended in a film of PVDF polymer in a narrow band of distances above the top surface of the solar cell. Coatings were tested having thickness from about 40 microns to about 100 microns, and the resulting change in efficiency of the solar cell was measured. As shown in FIG. 9A, efficiency improvement in the solar cell was inversely proportional to wet coating thickness, with a 100 micron coating achieving more than a 4% increase in efficiency and a 40 micron coating achieving a nearly 7.5% increase in efficiency.

Figure 10:
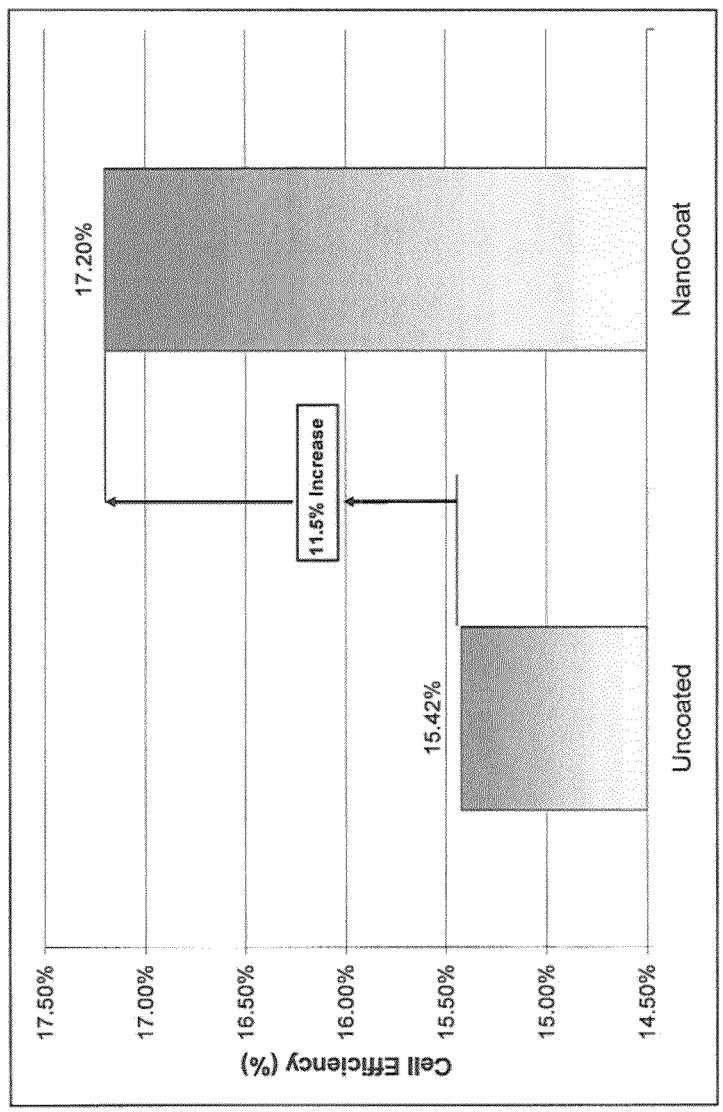
FIG. 10 is a bar graph showing a comparison in efficiency between an uncoated solar cell and a solar cell having an outer nanodiamond coating.

Other compositions of coatings have been tested, varying the concentration of nanodiamond particles and PVDF resin in the suspension, and efficiency improvements in excess of 10% have been achieved with 0.01% w/w nanodiamond particles and 0.1% w/w PVDF resin. For example, FIG. 10 illustrates an 11.5% increase in efficiency between a solar cell prior to coating having an efficiency of 15.4% and the same solar cell after an outer coating of nanodiamond particles was applied having an efficiency of 17.2%.

Without being bound by theory, the increase in efficiency of a solar cell having an outer nanodiamond coating is believed to result from the nanodiamond refracting sunlight reaching the solar panel. The net effect is to increase the flux of photons impinging on the photovoltaic material at normal or near normal incidence (which impart higher levels of energy onto the photovoltaic material) and to disperse the flux of photons that would otherwise impinge on the photovoltaic material at grazing angles (which impart relatively low levels of energy onto the photovoltaic material).

Figure 5:
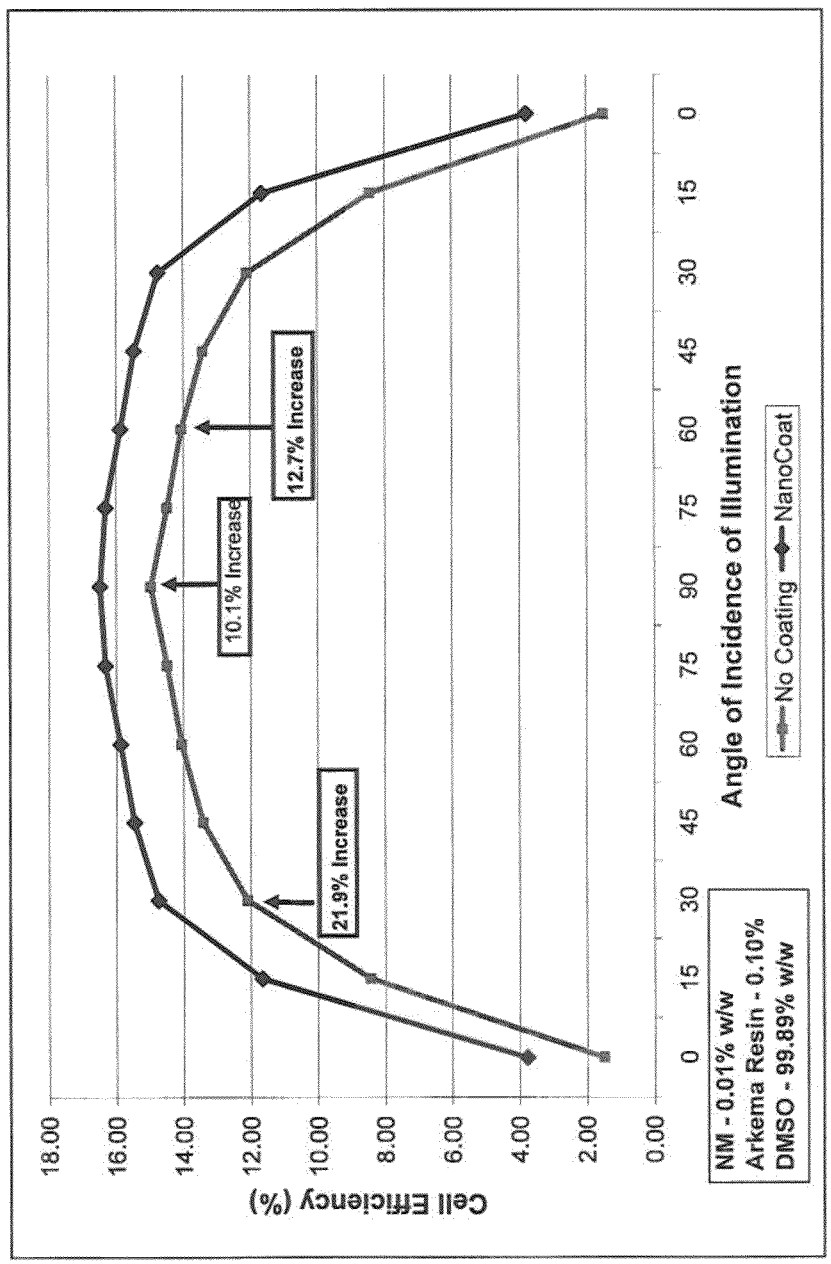
FIG. 5 is a graph comparing the efficiency of a solar cell including an outer nanodiamond coating with the efficiency of a standard solar cell without an outer nanodiamond coating, as a function of angle of sunlight incidence.

This phenomena can eliminate the need for expensive tracking systems, particularly on residential and commercial buildings, by enabling solar cells to achieve higher efficiencies at less direct angles of solar illumination. FIG. 5 shows test results for an outer nanodiamond coating made from 0.01% w/w nanodiamond particles, 0.1% w/w PVDF resin, and the balance DMSO. At an angle of sunlight incidence of 90 degrees (i.e., normal to the top surface of the solar cell, for which a conventional solar dell is most efficient), the nanodiamond outer coating increased solar cell efficiency by 10.1%. But even greater increases in efficiency were observed at angles of sunlight incidence away from normal. At a modest angle of incidence of 60 degrees (i.e., 30 degrees from normal), an efficiency increase of 12.7% was observed, and at a relatively shallow angle of incidence or 30 degrees (i.e., 60 degrees from normal), an efficiency increase of 21.9% was observed.

Figure 6:
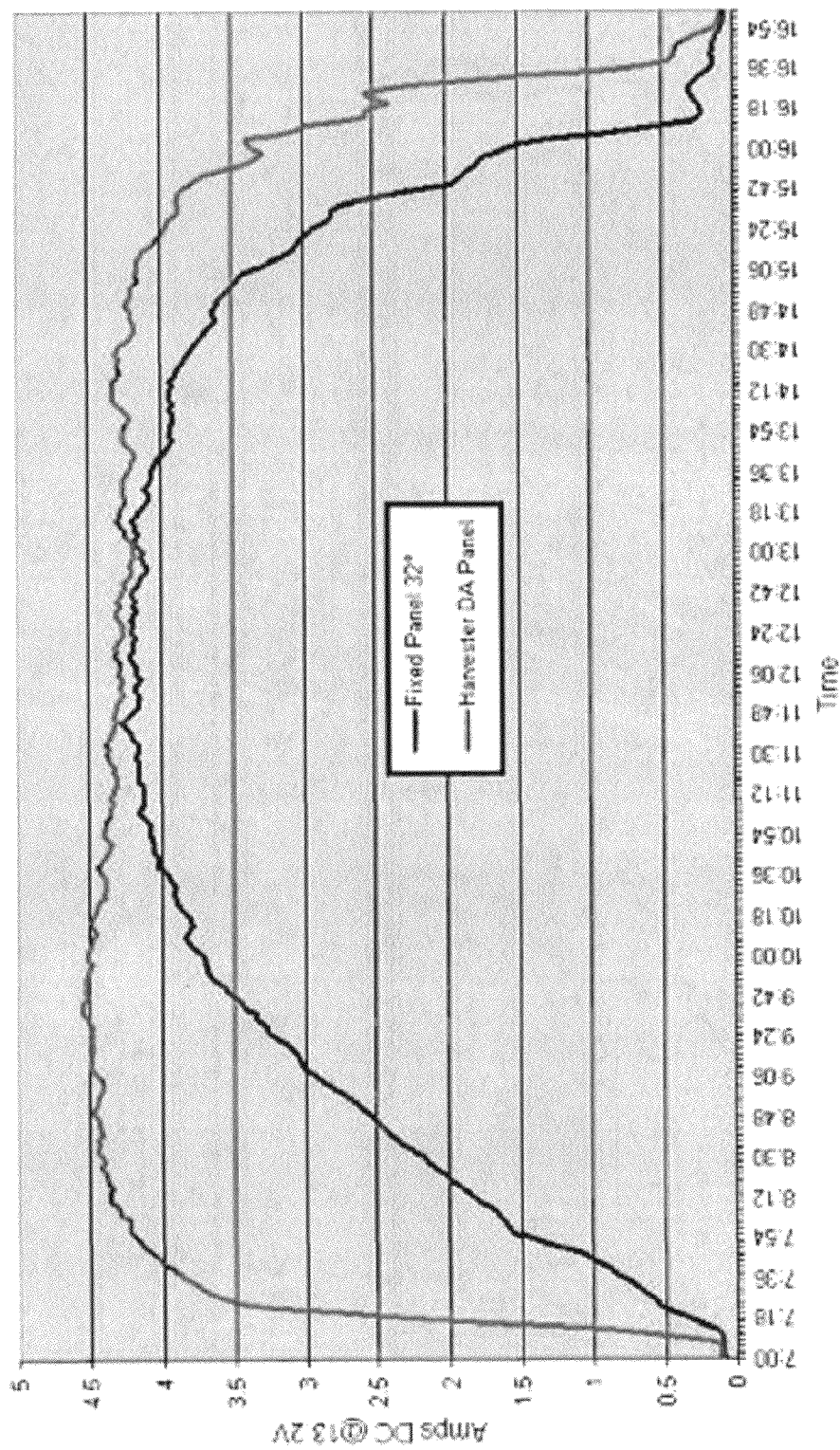
FIG. 6 is a graph comparing the output current of a solar cell mounted on a tracking mechanism with the efficiency of a solar cell mounted in a stationary position, as a function of time of day (as a proxy for angle of sunlight incidence).

The practical results of the increased efficiency at less than optimal sunlight incidence angles can be seen in FIG. 6, which compares the electricity output throughout the course of a day between a solar cell fixed on a roof and a solar cell mounted on an expensive, heavy mechanical tracking mechanism. At the peak of the sun, when the angle of incidence is closest to normal, the coated solar cell showed a slight increase of less than 3% as compared with the uncoated solar cell. But early and late in the day, even at times very close to sunrise and sunset, the solar cell with the tracking mechanism showed a dramatic increase in electricity production as compared to the fixed solar cell, sometimes by as much as 300%.

Comparing FIG. 6 (which shows the benefits of solar cell tracking) with FIG. 5 (which shows the improvements obtained by a nanodiamond outer coating), the similar plateau shape of the curves indicates that providing a nanodiamond outer coating can achieve similar benefits, at less cost and complexity, as mounting a solar cell on an expensive mechanical tacking mechanism.

Figure 7:
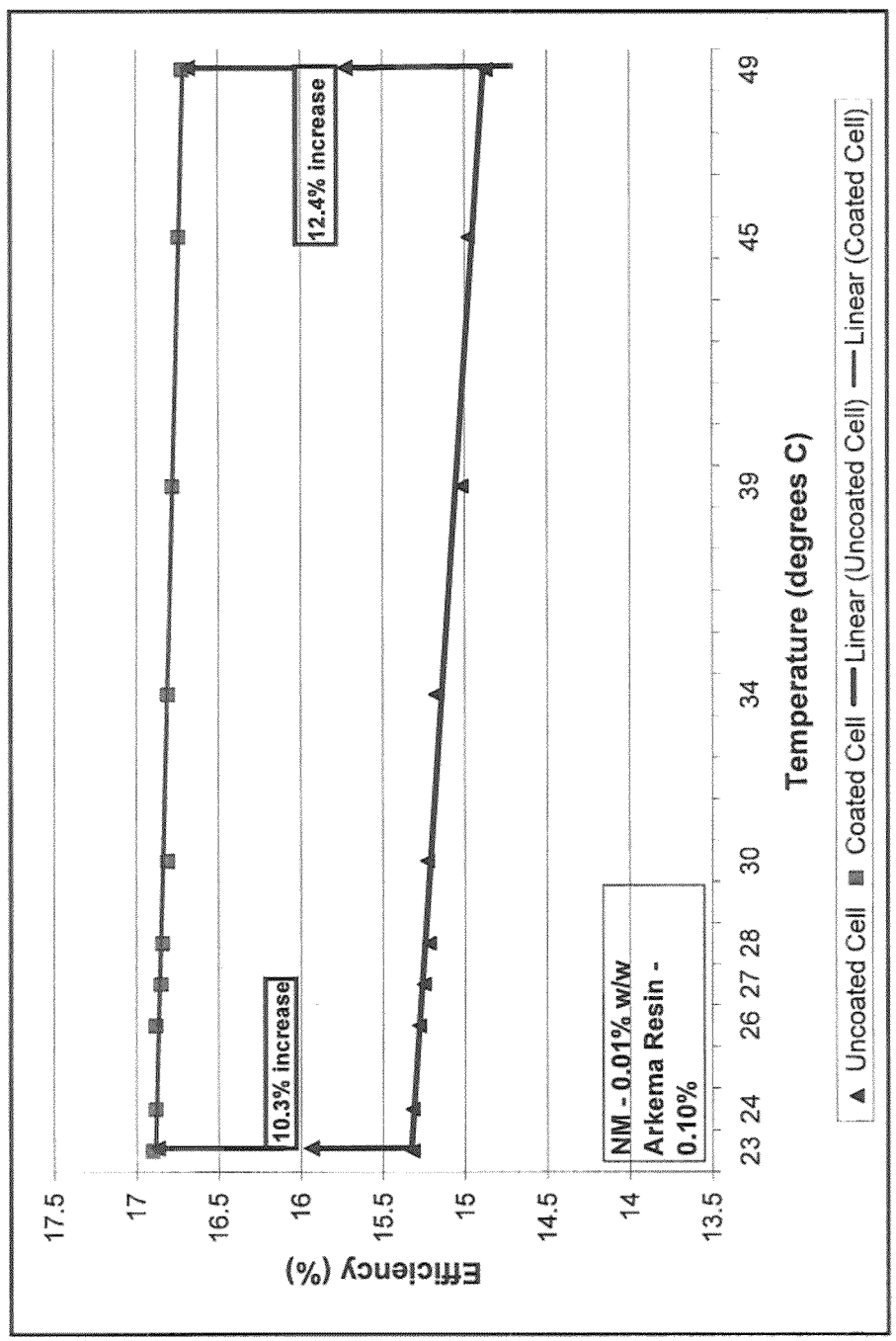
FIG. 7 is a graph comparing the efficiency of a solar cell including an outer nanodiamond coating with the efficiency of a standard solar cell without an outer nanodiamond coating, as a function of temperature.

A coated solar cell also shows improved performance due to the superior heat transfer capability of the nanodiamond particles in the coating, and this improvement increases as the temperature of the solar cell increases. Test results are shown in FIG. 7 comparing an uncoated cell and a cell coated with an outer coating including 0.01% w/w nanodiamond particles and 0.1% polymer resin. Even at 23° C. the coated cell, outperformed the uncoated cell, in terms of conversion efficiency by 10.3%. At 49° C., the improvement in efficiency was 12.4%. These results are due, at least in part, to the high thermal conductivity of the nanodiamond particles particles (in the form of nanocrystals), which dissipates heat generated by the solar cell. Because heat can degrade the efficiency of a solar cell, the ability of the nanodiamond particles to dissipate heat both perpendicularly from the surface as well as laterally across the surface contributes to improvements in efficiency.

Inner Nanomaterial Coating.

Figure 3:
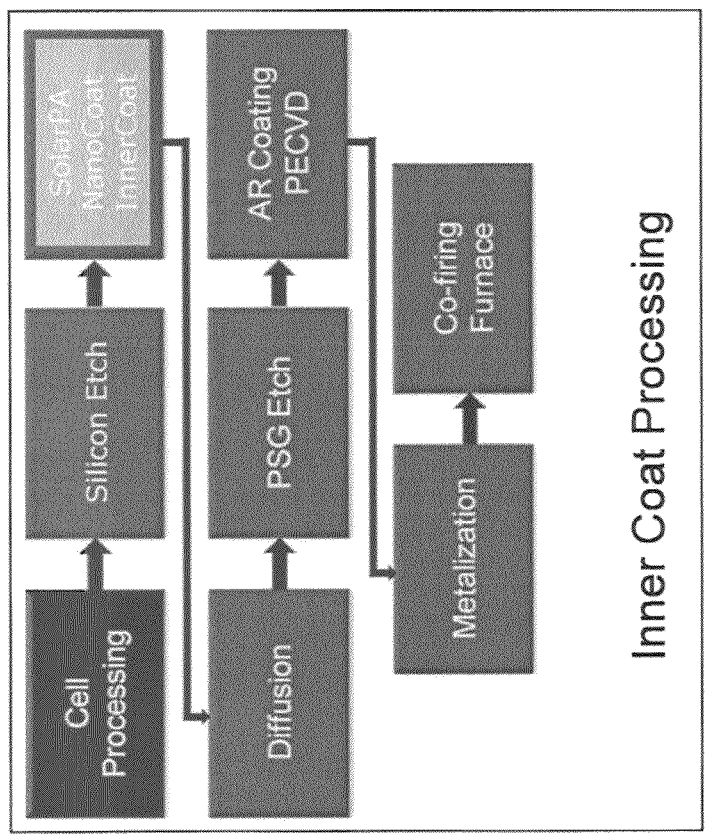
FIG. 3 is a flow chart showing a method of processing a solar cell including an inner nanodiamond coating.
Figure 4:
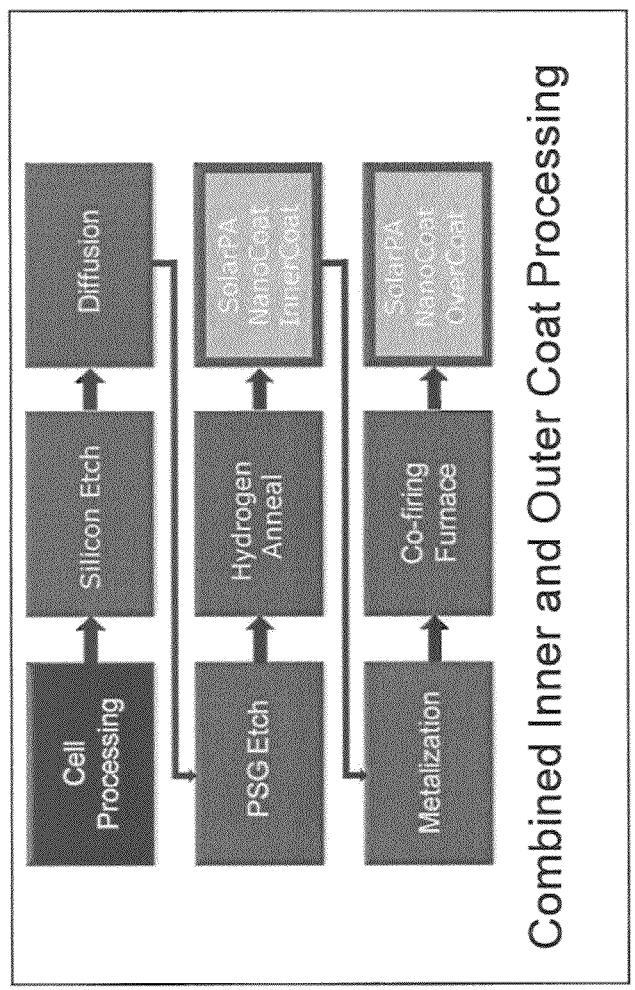
FIG. 4 is a flow chart showing a method of processing a solar cell including an outer nanodiamond coating and an inner nanodiamond coating.

FIG. 3 shows an exemplary process of making a solar cell having an inner nanodiamond coating. In particular, the inner nanodiamond coating is incorporated into a solar cell during manufacture of the solar cell. The inner nanodiamond coating is formed from nanodiamond particles in the absence of a binder or matrix material which might otherwise break down at the elevated temperatures to which the inner components of the solar cell will be exposed. In comparison to the conventional process shown in FIG. 1, a process using the inner nanodiamond coating can be used both to improve solar cell efficiency and to decrease manufacturing costs. First, texture etching of the silicon substrate can be eliminated. In addition, the compound step of anti-reflective (AR) coating and plasma-enhanced chemical vapor deposition (PECVD) can be simplified; the step of AR coating PECVD combines hydrogen annealing and PECVD, and the PECVD portion of the step can be eliminated and replaced with applying an inner nanodiamond coating.

Figures 8A, 8B:
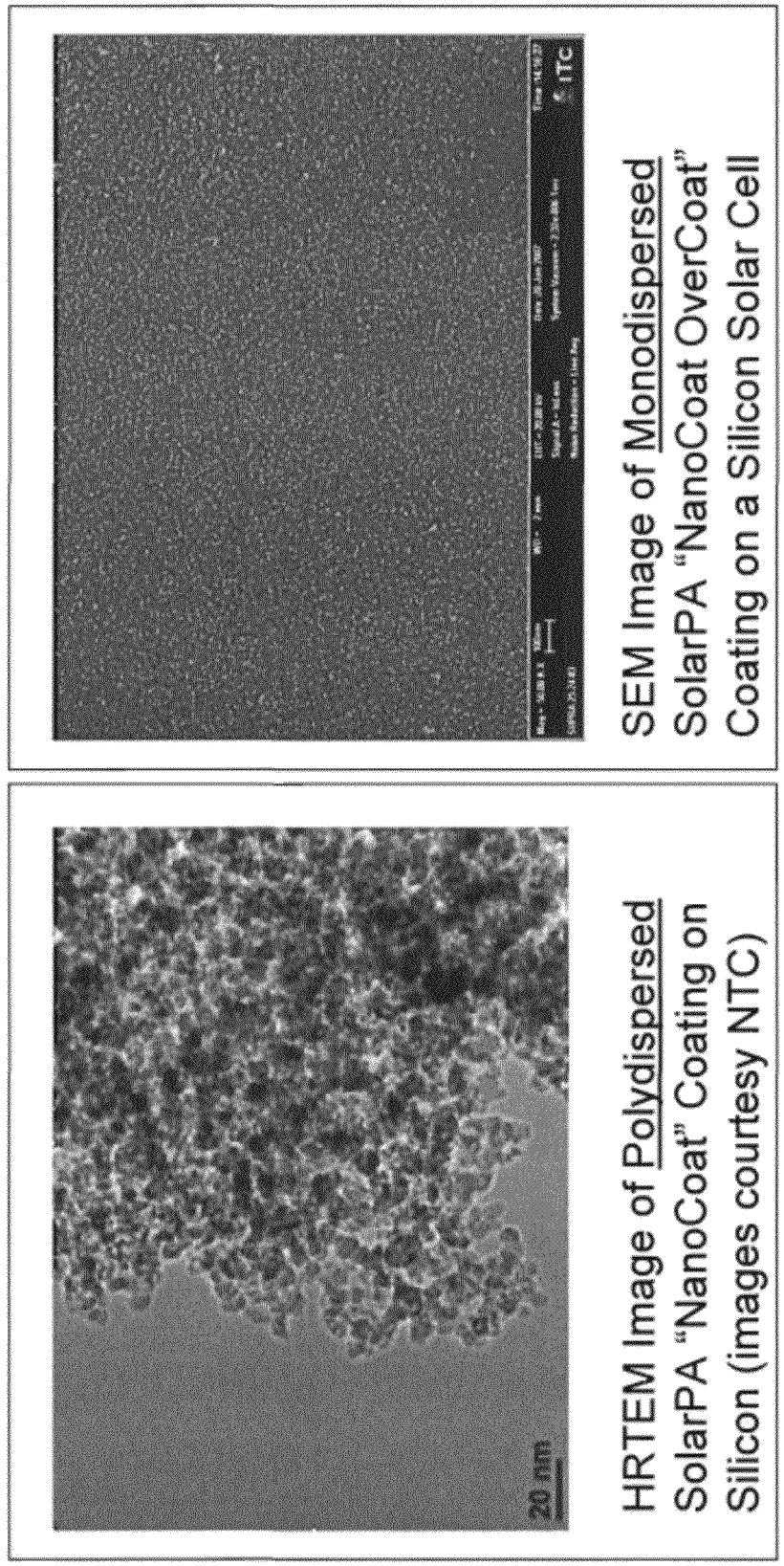
FIGS. 8A and 8B are scanning electron microscope photographs of polydispersed and monodispersed outer nanodiamond coatings, respectively, on a silicon solar cell.

The performance of the inner nanodiamond coating has been found to be best when a substantially uniform monodispersed layer of nanodiamond particles can be achieved on a silicon solar cell. FIGS. 8A and 8B show a comparison between a polydispersed coating (i.e., a coating having portions with a thickness of more than one nanodiamond particle) and a monodispersed coating.

Similarly to the outer coating, the inner nanodiamond coating may be applied to the top surface of the photovoltaic material by various methods, including using a manual blade method, screen printing, dip-coating, and spray coating. Alternatively, spin coating may be used. Excellent uniformity and thickness control of the coating can be achieved using blade coating, although other methods may be refined to produce similar results. To facilitate coating, the nanodiamond particles are suspended in water or a non-polymer solvent that will essentially completely evaporate once the nanodiamond particles are spread uniformly as desired. Suitable solvents include DMSO, isopropyl alcohol, and n-methylpyrrolidone (NMP).

The inner nanodiamond coating eliminates the need for an etching step that is conventionally used to texture the surface of the silicon substrate of a solar cell so as to scatter light and increase collection efficiency. In addition, the outer nanodiamond coating reduces the reflection of sunlight, thereby causing more photons to reach the solar cell and increasing the electrical output of the cell. This can eliminate the need for an anti-reflective coating that is often used on top of a conventional solar cell to reduce the number of reflected photons.

Figure 9B:
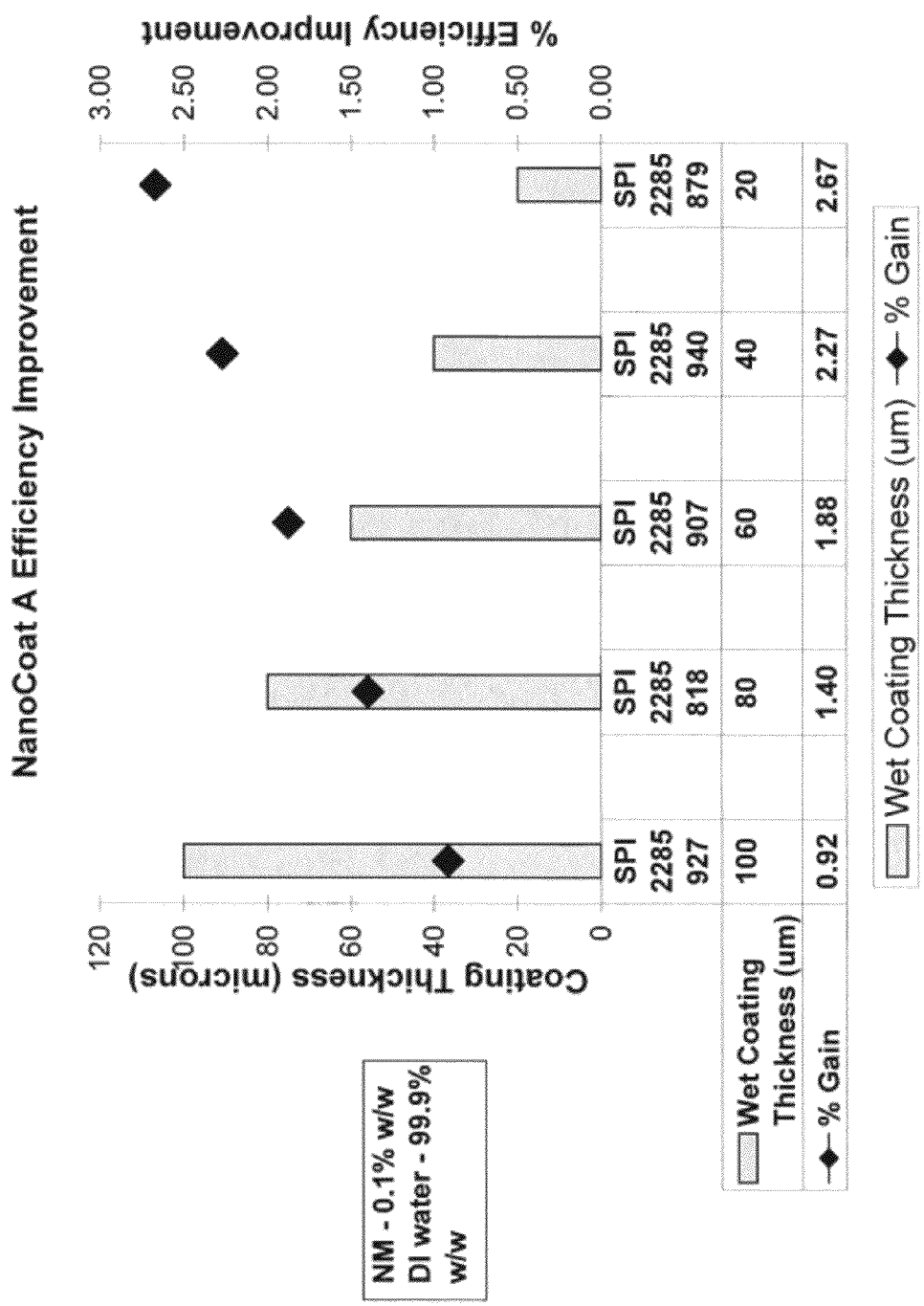
FIGS. 9B and 9C are graphs showing the efficiency of solar cells as a function of an inner nanodiamond coating thickness.
Figure 9C:
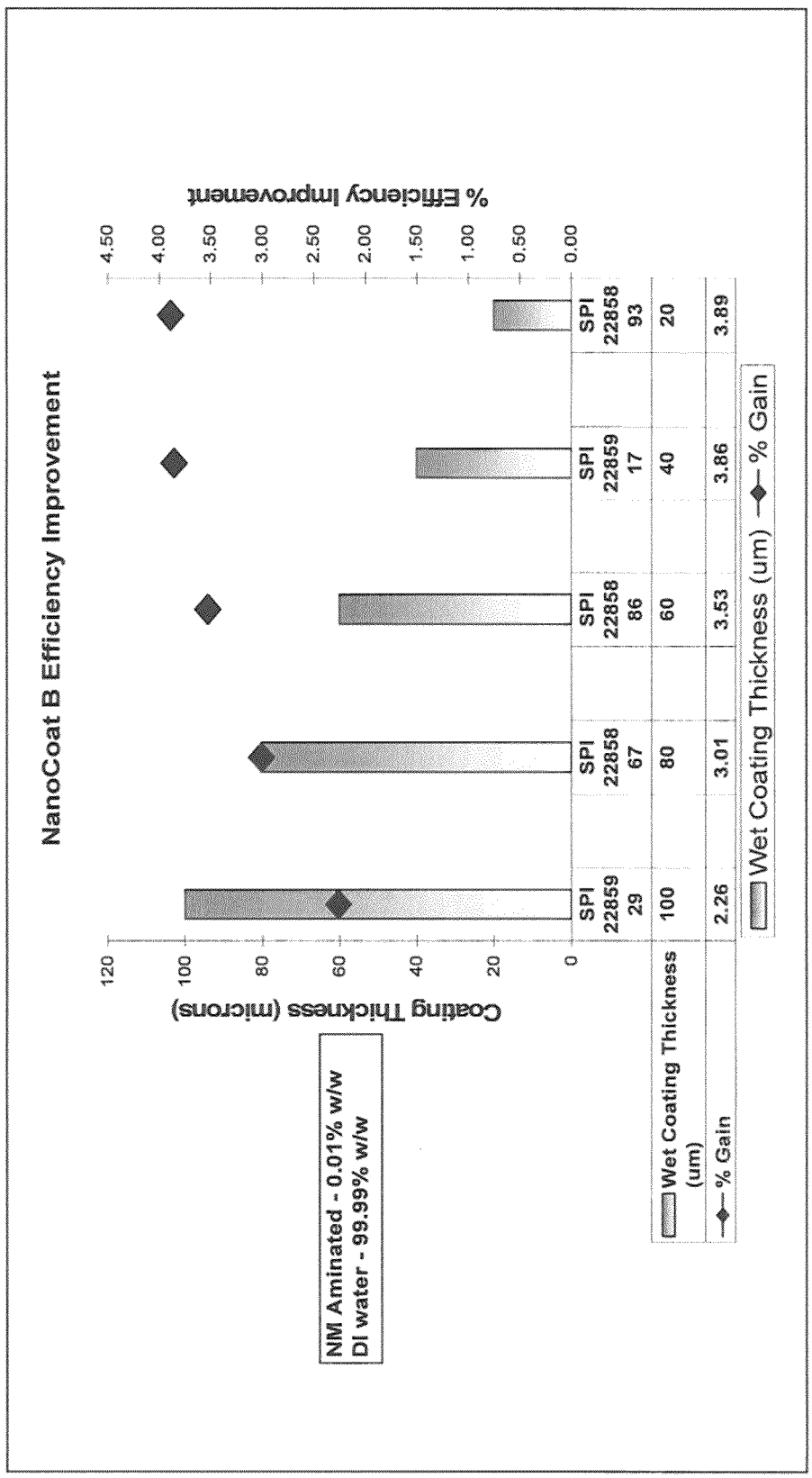

In testing on solar cells for which the silicon substrate had already been subjected to texture etching, efficiency improvements of over 3% have been achieved using an inner nanodiamond coating of 40 microns thickness or less (when wet). FIG. 9B shows that for a coating formulation including 0.1% w/w nanodiamond particles with the balance being DMSO, efficiency gains ranged from slightly less than 1% to more than 2.5%. Efficiency improvement for this formulation was almost directly inverse to inner coating thickness, with a wet coating thickness of 100 microns producing an efficiency improvement of 0.92% and a thickness of 20 microns producing an efficiency improvement of 2.67%. FIG. 9C shows even better results for a coating formulation including 0.01% w/w nanodiamond particles with the balance being DMSO, with maximum efficiency gains of nearly 4%. Efficiency improvement for this formulation improved generally with thinner coatings, but was about the same for coatings of 40 microns and 20 microns (3.86% and 3.89% respectively). Even at a relatively thick coating of 100 microns, an efficiency gain of 2.26% was achieved.

When both an inner nanodiamond coating and an outer nanodiamond coating are applied to a solar cell, a net improvement in efficiency results that is an aggregate of the efficiency improvements from each coating alone. Thus, the efficiency gained by texture etching and anti-reflective coating can be equaled by replacing these steps with the inner nanodiamond coating, but at a lower cost. By adding the outer nanodiamond coating, a total cell efficiency increase of up to 10% can be reliably achieved, exceeding the increase produced by texture etching and anti-reflective coating.

While reference has been made to specific embodiments, it is apparent that other embodiments and variations can be devised by others skilled in the art without departing from their spirit and scope. The appended claims are intended to be construed to include all such embodiments and equivalent variations.

What is claimed is:

1. A method of improving the efficiency of a solar cell, comprising:
   mixing a material consisting essentially of nanodiamond with a liquid polymer to form a nanodiamond-polymer suspension, wherein the liquid polymer is polyvinylidene fluoride;
   applying the suspension on a top surface of a solar cell to form a coating thereon; and
   drying the coating such that a dried nanodiamond-polymer layer remains bonded to the top surface of the solar cell.

2. The method of claim 1, wherein the material consisting essentially of nanodiamond comprises particles having a size in the range from about 5 nm to about 7 nm.

3. The method of claim 1, wherein the suspension includes less than or equal to about 0.1% w/w of the material consisting essentially of nanodiamond.

4. The method of claim 1, wherein the step of forming a coating includes:
   screen printing the suspension on the top surface of the solar cell.

5. The method of claim 4, wherein the top surface is glass.

6. The method of claim 1, further comprising:
   mixing a material consisting essentially of nanodiamond with a non-polymer solvent to form a second suspension;
   applying the second suspension on a top surface of a photovoltaic material within the solar cell to form a coating thereon;
   drying the coating such that a dried nanodiamond-polymer layer remains bonded to the photovoltaic material.

7. The method of claim 6, wherein the second suspension includes less than or equal to about 0.1% w/w of the material consisting essentially of nanodiamond.

8. The method of claim 6, wherein the non-polymer solvent is dimethyl sulfoxide.

9. The method of claim 6, wherein the nanodiamond-polymer layer has a thickness less than or equal to about 0.1 micron.

10. The method of claim 1, wherein the top surface is glass.

11. A method of improving the efficiency of a solar cell, comprising:
    mixing a material consisting essentially of nanodiamond with a liquid polymer to form a nanodiamond-polymer suspension;

applying the suspension on a top surface of a solar cell to form a coating thereon; and drying the coating such that a dried nanodiamond-polymer layer remains bonded to the top surface of the solar cell;

wherein the nanodiamond-polymer layer has a thickness less than or equal to about 25 microns.

12. A method for improving the efficiency of a solar cell, comprising:

mixing a material consisting essentially of nanodiamond with a non-polymer solvent to form a suspension;

applying the suspension on a top surface of a photovoltaic material within the solar cell to form a coating thereon;

drying the coating such that a dried nanodiamond layer remains bonded to the photovoltaic material;

mixing a material consisting essentially of nanodiamond with a polymer solvent to form a nanodiamond-polymer suspension;

forming a coating of the nanodiamond-polymer suspension on the top surface; and drying the coating such that a dried nanodiamond-polymer layer remains bonded to the solar cell.

13. The method of claim 12, wherein the suspension includes less than or equal to about 0.1% w/w of the nanodiamond material, and wherein the non-polymer solvent is dimethyl sulfoxide.

14. The method of claim 12, wherein the nanodiamond layer has a thickness less than or equal to about 0.1 micron.

15. The method of claim 12, wherein the nanodiamond-polymer suspension includes less than or equal to about 0.1% w/w of the nanodiamond material.

16. The method of claim 12, wherein the nanodiamond-polymer layer has a thickness less than or equal to about 100 microns.

17. The method of claim 12, wherein the top surface is glass.

18. A method of improving the efficiency of a solar cell, comprising:

mixing a material consisting essentially of nanodiamond with a liquid polyvinylidene fluoride polymer to form a nanodiamond-polymer suspension;

applying the suspension on a top surface of a solar cell to form a coating thereon; and drying the coating such that a dried nanodiamond-polymer layer remains bonded to the top surface of the solar cell.

19. The method of claim 18, wherein the nanodiamond-polymer layer has a thickness less than or equal to about 25 microns.

20. The method of claim 18, further comprising:

mixing a material consisting essentially of nanodiamond with a non-polymer solvent to form a second suspension;

applying the second suspension on a top surface of a photovoltaic material within the solar cell to form a coating thereon;

drying the coating such that a dried nanodiamond-polymer layer remains bonded to the photovoltaic material.

21. The method of claim 20, wherein the second suspension includes less than or equal to about 0.1% w/w of the material consisting essentially of nanodiamond.

22. The method of claim 20, wherein the non-polymer solvent is dimethyl sulfoxide.

23. The method of claim 20, wherein the top surface is glass.

24. The method of claim 18, wherein the top surface is glass.

25. A method for improving the efficiency of a solar cell, comprising:

mixing a material consisting essentially of nanodiamond with a non-polymer dimethyl sulfoxide solvent to form a suspension including less than or equal to about 0.1% w/w of the nanodiamond material;

applying the suspension on a top surface of a photovoltaic material within the solar cell to form a coating thereon; and drying the coating such that a dried nanodiamond layer remains bonded to the photovoltaic material.

26. The method of claim 25, further comprising:

mixing a material consisting essentially of nanodiamond with a non-polymer solvent to form a nanodiamond-polymer suspension;

forming a coating of the nanodiamond-polymer suspension on a top surface of a solar cell;

drying the coating such that a dried nanodiamond-polymer layer remains bonded to the solar cell.

27. The method of claim 26 wherein the top surface is glass.

28. The method of claim 25, wherein the top surface is glass.

* * * * *